United States Patent
Rajendran et al.

(10) Patent No.: US 6,876,223 B2
(45) Date of Patent: Apr. 5, 2005

(54) REDUCING ELECTRO MAGNETIC INTERFERENCE (EMI) IN INTEGRATED CIRCUITS OPERATING ON BOTH ANALOG AND DIGITAL SIGNALS

(75) Inventors: Gireesh Rajendran, Bangalore (IN); Anil Kumar, Bangalore (IN); Debapriya Sahu, Bangalore (IN); Srinivasan Venkatraman, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 445 days.

(21) Appl. No.: 10/201,983

(22) Filed: Jul. 25, 2002

(65) Prior Publication Data

US 2004/0017671 A1 Jan. 29, 2004

(51) Int. Cl.[7] .......................... H03K 17/16; H04B 3/28
(52) U.S. Cl. ............................................ 326/21; 333/12
(58) Field of Search ............................. 326/21, 26, 82, 326/83; 333/12; 327/551

(56) References Cited

U.S. PATENT DOCUMENTS

| | | | | |
|---|---|---|---|---|
| 5,081,374 A | * | 1/1992 | Davis | ........................... 326/27 |
| 6,008,705 A | * | 12/1999 | Ghoshal | ........................ 333/1 |
| 6,184,702 B1 | * | 2/2001 | Takahashi et al. | ............. 326/21 |
| 6,337,798 B1 | * | 1/2002 | Hailey et al. | ................ 361/763 |
| 6,670,830 B2 | * | 12/2003 | Otsuka et al. | ................. 326/86 |
| 6,703,868 B2 | * | 3/2004 | Savaria et al. | ............... 326/101 |

* cited by examiner

Primary Examiner—Don Le
(74) Attorney, Agent, or Firm—Ronald O. Neerings; Wade James Brady, III; Frederick J. Telecky, Jr.

(57) ABSTRACT

EMI caused on a sensitive pin by large electric current flowing through a load pin when driving a high load is reduced or substantially eliminated. An equal amount of current, but in opposite direction, is caused to be flown in another pin ("third pin") located close to the load pin. As a result, the EMI caused by the third pin cancels the EMI generated by the load pin. During a discharge phase, a fourth pin carries and equal amount of current, but in opposite direction, to that in the load pin. The third and fourth pins may be formed by power supply pin and ground pin. A control path may avoid a path from the third pin to the fourth pin during both the charging and discharging phases. In addition, the high load may be driven by a programmable driver which uses an amount of current proportionate to the extent of load, thereby avoiding parasitic currents. EMI is further reduced as a result.

37 Claims, 4 Drawing Sheets

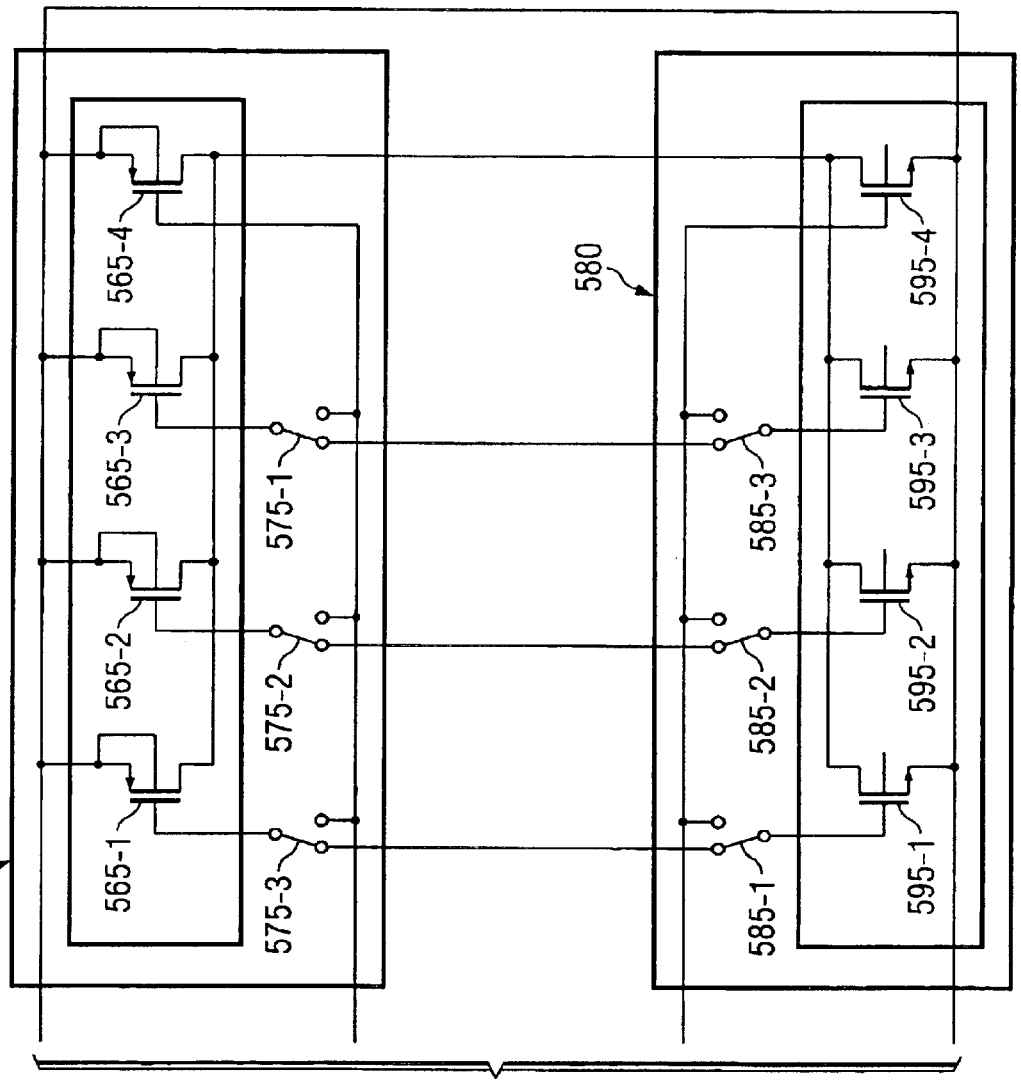

REDUCING ELECTRO MAGNETIC INTERFERENCE (EMI) IN INTEGRATED CIRCUITS OPERATING ON BOTH ANALOG AND DIGITAL SIGNALS

BACKGROUND OF THE INVENTION

1. Field of the Invention

The present invention relates to integrated circuits, and more specifically to a method and apparatus for reducing electro magnetic interference (EMI) in integrated circuits which operate on both analog and digital signals ("mixed signals").

2. Related Art

Integrated circuits often operate on both analog and digital signals. A digital signal is generally associated with a value depending on the specific one of the several possible discrete signal levels. For example, a voltage level of approximately +5 Volts may be interpreted as a logical one and 0 Volts (or −5 volts) may be interpreted as a logical zero.

On the other hand, an analog signal is generally characterized by a continuous signal level. As an illustration, an analog signal may have any voltage level between a maximum and minimum values at a specific point of time. Integrated circuits operating on both analog and digital signals are commonly referred to as mixed signal circuits.

Mixed signal circuits are used in several areas such as communications (transmission and reception of signals), industrial applications (e.g., motor control, power control), consumer devices (e.g., camera, watch). For example, a mixed signal circuit may receive an analog signal representing voice and convert to corresponding digital samples. The digital samples may then be processed in a desired manner in a digital domain. In the alternative, digital signals may be converted to an analog signal (e.g., sound) by mixed signal circuits.

One problem often encountered in mixed signal circuits is Electro Magnetic Interference (EMI). EMI generally refers to undesirable noise generated when a signal is transmitted on/through an impedance. The EMI caused by one ("first signal") of the analog and digital signals on the other ("second signal") may be unacceptably high when the first signal is substantially stronger than the second signal.

For example, a low voltage analog signal may be received on a pin of a mixed signal circuit, and digital samples may be generated based on the analog signal. The digital samples may need to be provided with large current, for example, to drive higher loads (or low impedance load). The EMI resulting from the large current may introduce unacceptably high noise levels into the input analog signals.

In one prior approach, the undesirable noise is reduced (or eliminated) by operating a mixed signal circuit in differential mode, in which a signal level is determined based on the difference of signal levels on two paths/points. Due to the determination of the difference, the noise in the two paths/points may get canceled. One problem with such an approach is that more pins and/or extra circuitry may be required. The resulting extra circuitry and space consumption may be undesirable.

What is therefore required is a method and apparatus for reducing electro magnetic interference (EMI) in integrated circuits which operate on both analog and digital signals.

SUMMARY OF THE INVENTION

An aspect of the present invention reduces electro magnetic interference (EMI) caused by a first pin on a second pin. Such a feature may be important when the first pin carries a strong signal and a second pin carries a weak signal. The feature may be attained by using a third pin, and ensuring that a second signal flowing in the third pin is equal in magnitude but opposite in direction to the strong signal flowing in the first pin.

Due to the opposite direction, the EMI introduced by the first pin (on the second pin) is canceled by the EMI introduced by the third pin. By ensuring that the third pin is substantially similar in electrical characteristics to the first pin, the EMI caused by the first pin may be eliminated substantially.

In one embodiment, the first pin is coupled to a load (representing a processor to which a bit value is to be provided) and the strong signal represents an electric current used to charge the load. The embodiment may further contain a fourth pin which is designed to carry a third signal when the load is discharged, with the third signal being equal in magnitude and opposite in direction to a fourth signal passing through the first pin when the load is discharged.

As a result, the EMI introduced by the first pin on the second pin when the load is discharged, may also be canceled by the EMI introduced by the fourth pin. In one implementation, the third and fourth pins respectively correspond to power supply pin and ground pin, and solutions can be implemented without using additional pins to reduce EMI.

A control logic may be used to ensure that a path does not exist between the fourth pin and the third pin during both discharging and charging phases. As a result, the equality requirement during both the charging and discharging may be attained, thereby minimizing the EMI introduced by the first pin on the second pin.

According to another aspect, a first transistor may be coupled to the third pin and a second transistor may be coupled to the fourth pin. The first pin in such an embodiment may be coupled to a node connecting a drain terminal of both of the first transistor and the second transistor. The control logic may then be coupled to a gate terminal of both of the first transistor and the second transistor. The control logic turns on/off the two transistors by asserting appropriate values on the gate terminals, thereby ensuring that a direct path is not present between voltage supply and ground during both the charging and discharging phases.

One more aspect of the present invention reduces the EMI further by reducing the parasitic currents. The parasitic currents may be reduced by implementing the first transistor in the form of multiple transistors. Only some of the transistors may be turned on, with the number of transistors turned on being proportionate to the load. As a result, parasitic currents may be further minimized, thereby leading to further reduction in EMI introduced into the signals carried by the first pin.

Further features and advantages of the invention, as well as the structure and operation of various embodiments of the invention, are described in detail below with reference to the accompanying drawings. In the drawings, like reference numbers generally indicate identical, functionally similar, and/or structurally similar elements. The drawing in which an element first appears is indicated by the leftmost digit(s) in the corresponding reference number.

BRIEF DESCRIPTION OF THE DRAWINGS

The present invention will be described with reference to the accompanying drawings, wherein.

FIG. (FIG.) 1 is a block diagram illustrating the details of an example device in which the present invention may be implemented.

DETAILED DESCRIPTION OF THE PREFERRED EMBODIMENTS

1. Overview and Discussion of the Invention

An aspect of the present invention reduces the electro-magnetic interference (EMI) by one pin on a sensitive pin in mixed signal integrated circuits. The EMI caused by the one pin is minimized by using another pin located close to the one pin. The embodiment may then make sure that the current flowing to one load pin is equal in magnitude and opposite in direction to the current through the another pin. Due to such a feature, the EMI introduced by the load pin is canceled by the EMI caused by the another pin.

In an embodiment, the one pin is connected to drive a load, and may thus be referred to as a load pin. When the load is being charged, the another pin may correspond to a voltage supply pin. When the load is being discharged, the another pin may correspond to a ground pin. Due to such an approach, additional pins may not be required and EMI may be reduced without using substantially more space and/or other pins in a mixed signal circuit.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well-known structures or operations are not shown in detail to avoid obscuring the invention.

2. Example System

Figure 1:
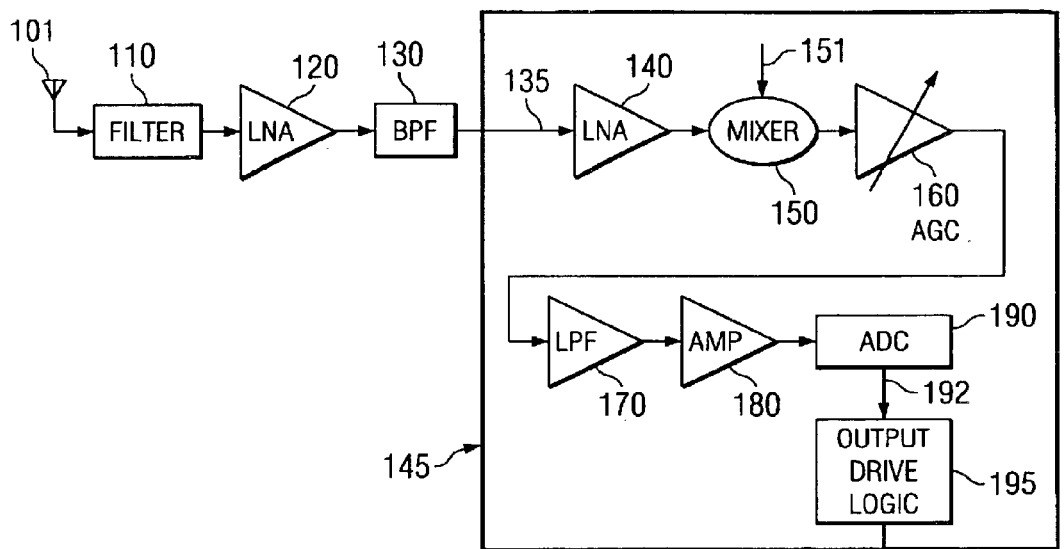

FIG. 1 is a block diagram of receiver system 100 illustrating an example system in which the present invention may be implemented. For illustration, it is assumed that receiver system 100 is implemented within a Global Positioning System Receiver. However, receiver system 100 can be implemented in other devices (e.g., mobile phone, etc.) which generally require low power consumption.

Receiver system 100 is shown containing antenna 101, filter 110, low noise amplifier (LNA) 120, band pass filter 130, package 145, and a processing unit (not shown). Each component is described in further detail below.

Antenna 101 may receive various signals transmitted from satellites, etc. The received signals may be provided to filter 110. Filter 110 may perform a corresponding transfer function to generate signals of the frequencies of interest. The generated signals are provided to LNA 120 in the form of analog signals. Antenna 101 and filter 110 may be implemented in a known way.

LNA 120 amplifies the analog signals received on line 112 to generate a corresponding amplified signal on line 123. Band pass filter (BPF) 130 may filter the amplified signal to remove any noise components that may be present. The filtered signal thus generated may be provided to package 145, which converts the analog signal to digital values as described below.

Package 145 is shown receiving an analog signal of low strength on pin 135 and generating digital data on pin 197. Package 145 is shown containing LNA 140, mixer 150, automatic gain controller 160, filter circuit 170, amplifier 180, and analog to digital converter (ADC) 190. Each component is described below in further detail.

LNA 140 may again amplify the filtered signal on pin 135 and provide the amplified filtered signal to mixer 150. In general, the analog signal received on pin 135 has low strength and thus the signal needs to be amplified before applying to mixer 150. LNAs 120 and 140, and BPF 130 may also be implemented in a known way.

Mixer 150 may be used to convert a high frequency signal to a signal having any desired frequency. In an embodiment, a signal of frequency 1575 MHz is converted to a 4 Mhz signal. Mixer 150 may receive filtered amplified signal and a signal of fixed frequency as inputs. The signal (on path 151) of fixed frequency may be generated by a phase locked loop (not shown) in a known way.

Automatic gain control (AGC) 160 may be used to amplify or attenuate the signal (from mixer 150) according to various requirements. For example, if a user using a mobile phone is in an area where the signals received are of low strength, and AGC 160 amplifies the signal accordingly. Similarly, if the user moves to an area where the signal strength is relatively higher, AGC 160 may attenuate the signal.

Filter circuit 170 may remove several undesired components present in the signal received on line 167 to generate a filtered signal. The filtered signal may be provided to amplifier 180. Amplifier 180 may further amplify the signal received on line 178 to generate an amplified signal. The amplified signal may be provided to analog to digital converter (ADC) 190. It may be noted that all the above components of FIG. 1 operate on signals that are analog in nature.

ADC 190 samples the amplified analog signal received on line 189 to generated several digital samples. The digital samples are provided to a processing unit (not shown), which may be modeled as a capacitive load $C_L$ 199 for the purpose of understanding several aspects of the present invention. Accordingly, output drive logic 195 is shown receiving the digital samples and driving load $C_L$ 199 as described below. A bit of a digital value may be viewed as a digital signal, and the manner in which only a digital signal is sent to capacitive load $C_L$ 199 is described for conciseness.

Output drive logic 195 receives digital signal on line 192 and provides the received digital signal to load $C_L$ 199. In general, load $C_L$ 199 needs to be driven with a high strength, and accordingly a large current may be present on pin 197 while driving the load. The large current on load pin 197 may induce an undesirable noise (EMI) on pin 135 ("sensitive pin") which carries an analog signal of low strength as noted above. The EMI may form a substantial part of the overall signal generated on pin 135, and may thus be undesirable. The manner in which the EMI or undesirable noise may be reduced is described below with reference to FIG. 2.

3. Method

Figure 2:
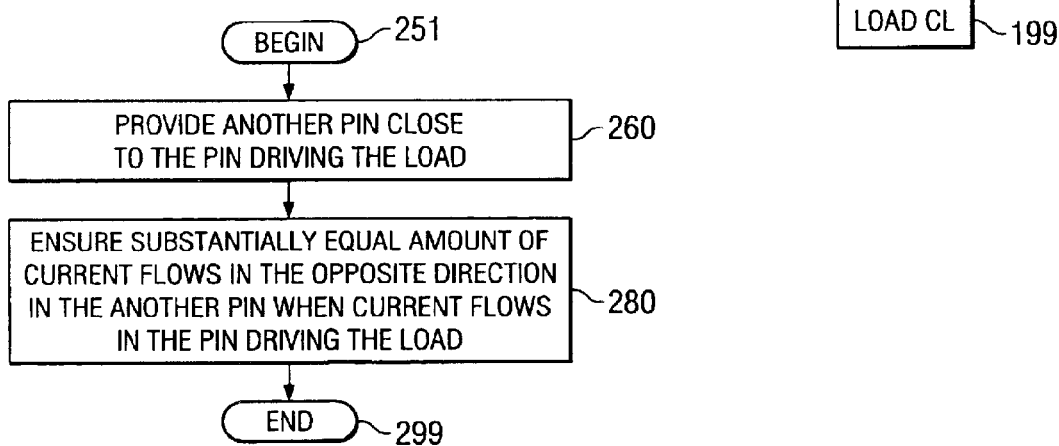
FIG. 2 is a flow-chart illustrating a method by which EMI can be reduced in mixed signal integrated circuits according to an aspect of the present invention.

FIG. 2 is a flow-chart illustrating a method by which EMI can be reduced in mixed signal integrated circuits according to an aspect of the present invention. The method is described with reference to FIG. 1 for illustration. However, the method can be implemented in other devices as well. The method begins in step 251 in which control passes to step 260.

In step 260, another pin is provided in addition to a pin causing the undesired EMI. It is generally desirable that the two pins be located close to each other. For example, in the receiver system 100 described above, load pin 197 carries high current and may thus cause undesirable noise in pin 135. Another pin is provided close to load pin 197, to reduce EMI as described in the sections below.

In step 280, an amount of current equal to the current in load pin 197, but opposite in direction is made to flow in the another pin. As the two currents are equal and are flowing in opposite directions, the noise induced in sensitive pin 135 due to the currents in load pin 197 and another pin may get canceled. The method ends in step 299.

In the description above of FIG. 2, the electrical current carried by load pin 197 represents the strong one, and the signal on pin/path 135 represents the weaker one of the analog and digital signals processed by a mixed signal circuit. However, various aspects of the present invention allow the EMI caused by a strong analog signal to be reduced or eliminated when/if the EMI could unduly interfere with a weak digital signal.

The description is continued with reference to an example system implementing the approach described above with reference to FIG. 2. First, the theoretical basis for cancellation of the EMI due to the operation of FIG. 2, is provided briefly.

4. Theory

Considering an example system with three pins (P0, P1, and P2) and that pins P0 and P1 respectively have lead inductances L0 and L1. Assume that pins P0 and P1 introduce undesirable noise in a signal carried by pin P2 having lead inductance Lm. The noise voltage induced by L0 and L1 in Lm is given by equations (1) and (2) respectively.

$$Vm1 = jw \cdot Km1 \cdot \sqrt{(L0 \cdot Lm)} \cdot I1 \qquad \text{Equation (1)}$$

$$Vm2 = jw \cdot Km2 \cdot \sqrt{(L1 \cdot Lm)} \cdot I2 \qquad \text{Equation (2)}$$

wherein Km1 and Km2 are coupling factors, I1 and I2 are currents flowing through L0 and L1 respectively, w=2*Pi* frequency wherein Pi=22/7, j represents phase shift or reactive term.

Assuming as Km1=Km2=Km and L0=L1=L, then equations (1) and (2) can be re-written as shown below.

$$Vm1 = jw \cdot Km \cdot \sqrt{(L \cdot Lm)} \cdot I1 \qquad \text{Equation (3)}$$

$$Vm2 = jw \cdot Km \cdot \sqrt{(L \cdot Lm)} \cdot I2 \qquad \text{Equation (4)}$$

The total noise introduced in Lm is Vm=Vm1+Vm2 and can be made zero if I1=−I2. Both the pins which are connecting with L0 and L1 should carry an equal amount of current in opposite direction to reduce the noise coupled to Lm. Thus, the noise generated by load pin 197 can be eliminated by ensuring an equal amount of current in opposite direction through another pin.

From the above, it may be appreciated that by providing another pin close to the pin which causes undesirable noise and allowing substantially an equal amount of current in opposite direction, the undesirable noise generated by the pin can be (substantially) eliminated. An example implementation of the approach is described below.

5. Output Drive Logic with Another Pin

Figure 3A:
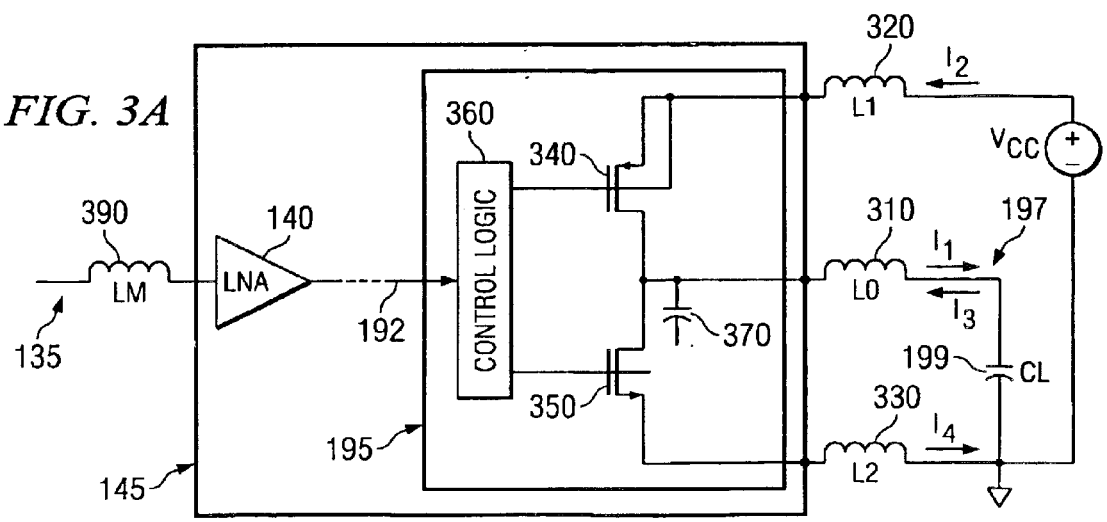
FIG. 3A is a circuit diagram illustrating the details of output drive logic in one embodiment of the present invention.

FIG. 3A is a circuit diagram illustrating the manner in which output drive logic 195 can be implemented in an embodiment of the present invention. FIG. 3A is shown containing lead inductances L0 310, L1 320, L2 330 and Lm 390, transistors 340 and 350, load $C_L$ 199, control logic 360, and parasitic capacitance Cp 370. Each component is described below in detail.

Lead inductance L0 310 represents the inductance of load pin 197 which may introduce undesirable noise in input analog signal received on pin 135. Load pin 197 may cause undesirably large amount of EMI in pin 135 when a high current flows to load $C_L$ 199. As described below the EMI is canceled by lead inductances 320 or 330 depending on whether load $C_L$ 199 is being charged or discharged respectively.

Lead inductance L1 320 represents the inductance of supply (Vcc) pin. Supply (Vcc) pin may be implemented to carry an equal and opposite current I2 as that of load pin 197 while load $C_L$ 199 is charging. Load $C_L$ 199 charges from supply (Vcc) through lead inductances L1 320, L0 310 and PMOS transistor 340.

Lead inductance L2 330 represents the inductance of ground pin. Ground pin may carry an equal and opposite current I3 as that of load pin 197 while load $C_L$ 199 is discharging. Load $C_L$ 199 may discharge through lead inductances L0 310, L2 330 and NMOS transistor 350.

Lead inductance Lm 390 represents the inductance of pin 135 which receives a low level analog signal. An undesirable noise generated by load pin 197 may interfere with the signal carried by pin 135.

Transistors 340 and 350 are respectively PMOS and NMOS transistors. PMOS transistor 340 turns on in response to a low/negative voltage and NMOS transistor 350 turns on in response to high/positive voltage on their respective gate terminals. PMOS transistor 340 and NMOS transistor 350 are respectively turned on while load $C_L$ 199 is charging and discharging as described below with reference to control logic 360.

Control logic 360 may receive digital data from ADC 190 on pin 192, and provides an inverted value to the gate terminals of both transistors 340 and 350 to charge and discharge load $C_L$ 199. Thus, a 1 on pin 192 turns on transistor 340 and turns off transistor 350, and the corresponding configuration (in which load $C_L$ 199 is charged) is described below with reference to FIG. 3B. A 0 on pin 192 turns off transistors 340 and turns on transistor 350. The corresponding configuration is described below with reference to FIG. 3C.

Figure 3B:
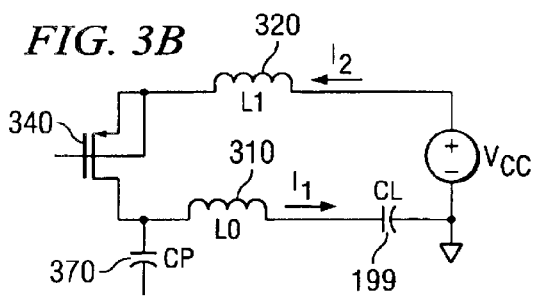
FIG. 3B is a circuit diagram illustrating the configuration of an embodiment of output drive logic in a charging mode.

FIG. 3B is a circuit diagram illustrating the configuration of output drive logic 195 when transistors 340 and 350 are respectively in on and off states. As may be appreciated, load $C_L$ is charged in the configuration. In addition, currents I2 (flowing in inductance 320) and I1 (flowing in inductance 310) are equal in magnitude and opposite in direction. Substantial equality would exist since inductance 330 is disconnected by transistor 350 being in an off state. The current ("parasitic current") in parasitic capacitor $C_P$ 370 causes the inequality in the current flows as will be apparent to one skilled in the relevant arts.

Figure 3C:
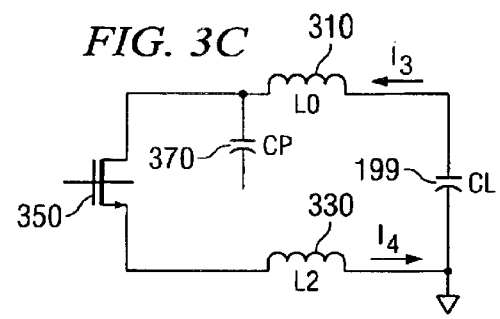
FIG. 3C is a circuit diagram illustrating the configuration of an embodiment of output drive logic in a discharging mode.

FIG. 3C is a circuit diagram illustrating the configuration of output drive logic 195 when transistors 340 and 350 are respectively in off and on states. As may be appreciated, load $C_L$ is discharged in the configuration. In addition, currents I3 (flowing in inductance 310) and I4 (flowing in inductance 330) are equal in magnitude and opposite in direction. Substantial equality would exist since inductance 320 is disconnected by transistor 340 being in an off state.

As may be readily appreciated, the configurations of both FIGS. 3B and 3C would eliminate/minimize EMI on pin 135 since the currents are equal in magnitude and opposite in direction. In addition, a direct path from supply (Vcc) pin to ground pin is avoided as both transistors 340 and 350 are not turned on simultaneously. As a result, substantially all the current from Vcc is forced through inductance L0 310 in FIG. 3A, and substantially all the current during discharge is forced through inductance L2 330. Thus, substantial mismatches in current are avoided in both configurations, thereby minimizing EMI.

Parasitic capacitance Cp 370 represents the capacitance between nodes and substrate of transistors 340 and 350. The extent of mismatch between currents I1 and I2 in FIG. 3B, and I3 and I4 in FIG. 3C depends on the amount of current Ip flowing through parasitic capacitance Cp 370. From FIG. 3 (B), current I2 equals (I1+Ip). If current Ip is made zero, then current I2 would equal to I1 and thus the EMI introduced by load pin 197 can be reduced.

In general, parasitic capacitance Cp 370 is higher when the size of driver transistors 340 and 350 is larger than that required to drive load $C_L$ 199. As noted above, more current Ip will create a correspondingly more mismatch. Thus, driver transistors size may need to be adjusted depending on load condition to reduce mismatch between currents I1 and I2 or I3 and I4.

The manner in which such an objective may be attained is described in further detail with reference to an example embodiment of control logic 360. The embodiment further illustrates the manner in which control logic may provided different amounts of current for different load strengths (capacitance) of load $C_L$ 199.

6. Control Logic

Figure 4:
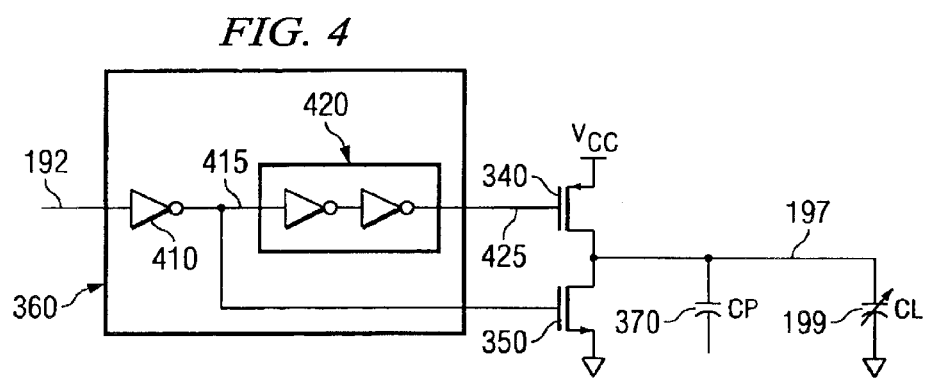
FIG. 4 is a circuit diagram illustrating the details of a control logic used in an embodiment of output drive logic.

FIG. 4 is a circuit diagram illustrating the details of control logic 360 in one embodiment. Control logic 360 is shown containing inverter 410, delay element 420. Each component is described below.

Inverter 410 inverts the digital data received on line 192, and provides the inverted value to driver transistors 340 and 350. As driver transistors 340 and 350 perform another inversion, the bit values received on line 192 are eventually applied to load $C_L$ 199.

Delay element 420 is shown containing two inverting stages which provides same digital data on line 425 as on line 415 after some delay. Delay element 420 ensures that NMOS transistor 350 will turn off before PMOS transistor 340 will turn on, thereby avoiding a direct path from supply to ground even for a short duration. For example, a high digital data on line 192 provides a low signal on line 415 after inverting by inverter 410. The low signal on line 415 turns off NMOS transistor 350 before it is applied to PMOS transistor 340 which turns on after some delay provided by delay element 420. Thus, control logic 360 may prevent any direct path from supply to ground pins.

Control logic 360 may also reduce through current ($I_p$) to parasitic capacitance Cp 370 by adjusting size of the driver transistors for different loads. Current flowing to load $C_L$ 199 is determined by the voltage Vgs between gate and source terminals of NMOS or PMOS transistors and their sizes, which is given by Equation (5) below.

$$I_{load} = K*(W/L)*(Vgs-Vt)^2 \quad \text{Equation (5)}$$

wherein K is a constant, W and L represent width and length of the operational driver transistor respectively, Vgs represents voltage across gate and source terminals and Vt is threshold voltage of the driver transistor.

From Equation (5), it may be observed that the load current ($I_{load}$) may be changed by adjusting the driver transistors size (W and L) to drive loads of different strength. Driver transistors size may be varied by connecting more transistors in parallel along with switches which are digitally controlled. The drive strength may be increased by turning on of each switch. Accordingly, load current may be adjusted while reducing through current to parasitic capacitance Cp 370 by turning on/off of each switch. An embodiment of output drive logic 195 containing programmable driver transistors is described below in detail with reference to FIG. 5.

7. Output Drive Logic Containing Programmable Driver Transistors

Figure 5A:
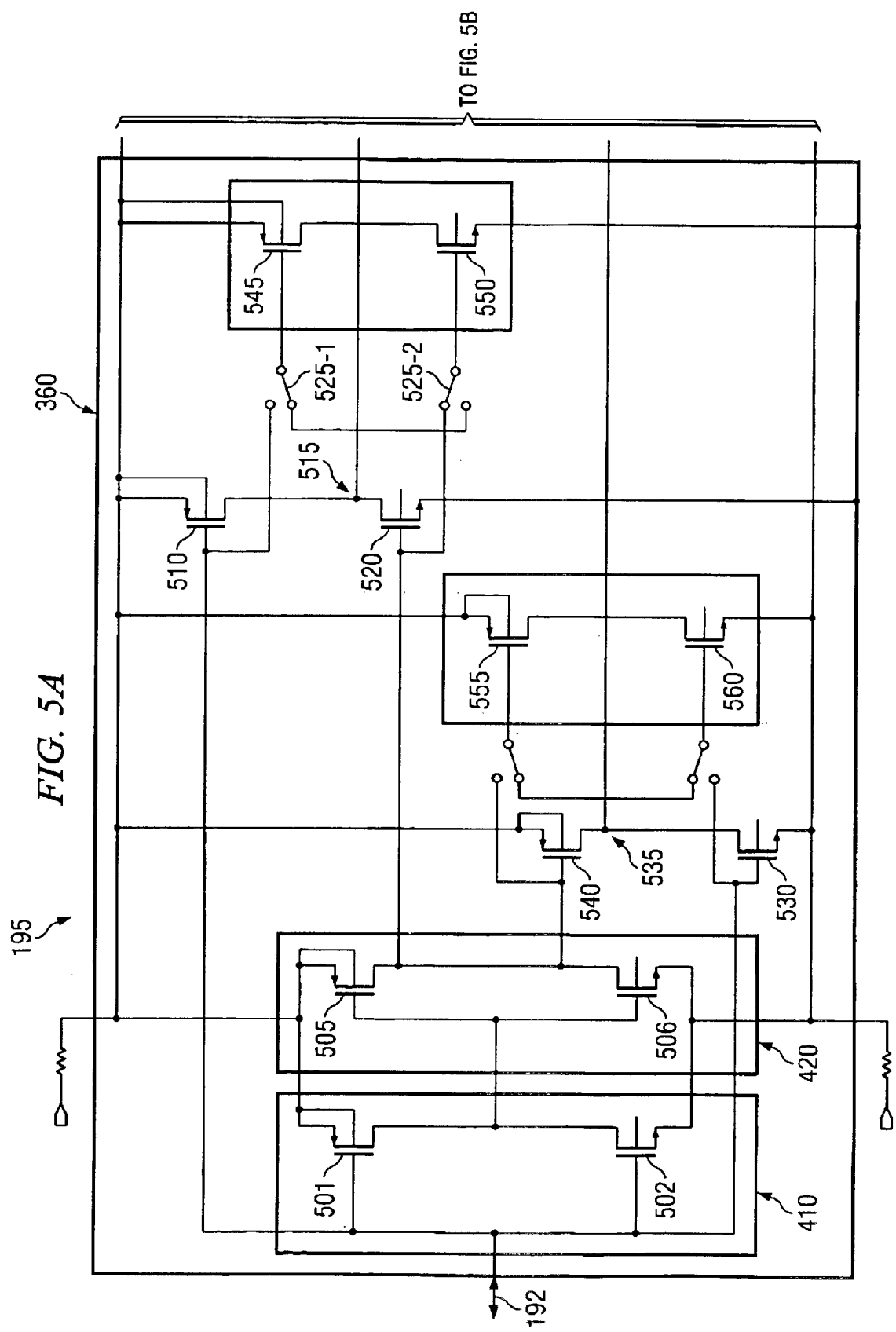
FIG. 5 is a circuit diagram illustrating additional details of an embodiment of control logic.

FIG. 5 is a circuit diagram illustrating the details of an embodiment of output drive logic 195 containing control logic 360 and two driver blocks 570 and 580. As may be appreciated driver blocks 570 and 580 respectively implement the task corresponding to transistors 340 and 350 as described in the below paragraphs. By using multiple transistors, the solutions can be designed to address different loads presented by load $C_L$ 199 as will be apparent from the description below. Driver blocks 570 and 580 are described first and then the components of control logic 360 are described.

Programmable driver transistor block 570 is shown containing four stages of PMOS transistors 565-1 through 565-4. PMOS transistor 565-4 is always connected to drive load $C_L$ 199. The remaining three transistors 565-1 through 565-3 are respectively placed in a connect or unconnected mode by switches 575-1 through 575-3 respectively.

In general, the transistors placed in the connect mode (along with transistor 565-4, treated as a connected transistor) operate to drive load $C_L$ 199. In particular, when node 515 is at a low logical level (0), the connected transistors drive load $C_L$ 199. On the other hand, when node 515 is at a high logical level, the connected transistors are in an off state and load $C_L$ 199 is unaffected by transistors 565-1 through 565-4.

Thus, in operation, the extent of load (in $C_L$ 199) to be driven may be determined and more transistors (of 565-1 through 565-3) may be placed in connect status to drive higher loads. As may be appreciated, turning on/off transistors causes a corresponding change in (W/L) factor of Equation 5, and output drive logic 195 can be configured (programmed) to drive different loads. In addition, as the effective transistor size is adjusted to match the extent of load ($C_L$ 199), current flowing through the parasitic capacitance (370 of FIG. 3A) may be minimized/avoided. As a result, the current mis-matches noted with FIGS. 3B and 3C can also be minimized/avoided, thereby reducing the EMI on input pin 135.

The operation of programmable driver transistor block 580 is described similarly except that node 535 controls whether NMOS transistors 595-1 through 595-4 discharge load $C_L$ 199. In addition, switches 585-1 through 585-3 are respectively ganged with switches 575-1 through 575-3. As a result of the ganging, both switches in each ganged pair are either in closed or open state together.

While the blocks 570 and 580 are shown implemented with four transistors each, the approach can be implemented with any number of driver stages. In general, the number of driver stages depends on the number of different load strengths an output drive logic 195 may need to be designed to operate with.

An intelligent controller (for example, DSP, not shown) may control the turning on/off of switches (575-1 through 575-3 and 585-1 through 585-3). For illustration, on power-up, if a driver transistor size is set to maximum strength, which may cause a high amount of EMI. After power-up, an intelligent controller may turn off few of the switches to adjust programmable driver transistors size and thereby causing the rise and fall times of digital signals on load pin 197 to degrade to a level just sufficient to drive load $C_L$ 199.

The description is now continued with reference to the manner in which control logic 360 further defines the operation of the two blocks (570 and 580) is described below. Control logic 360 of FIG. 5 is shown containing transistors 501 and 502, transistors 505 and 506, transistors 510, 520, 530, 540, 545, 550, 555, and 560. In relation to FIG. 4, transistors 501 and 502 together form inverter 410, and transistors 505 and 506 together form delay element 420. The remaining components of control logic 360 are described below.

Transistors 510, 520, 530, 540, 545, 550, 555, and 560 prevent simultaneous turn on of PMOS and NMOS programmable driver transistor blocks 570 and 580, which avoids a direct path from supply (Vcc) to ground. The manner in which such a result is attained by the operation of other transistors is described below.

Transistors 510 and 520 together control the voltage at node 515 (which in turn turns on/off PMOS transistors 565-1 through 565-4). If transistor 510 is off and transistor 520 is on, then voltage at node 515 is at low logical value. On the other hand, if transistor 510 is at on state and transistor 520 is in off state, voltage at node 515 is at a high logical value. Similarly, the on/off status of transistors 530 and 540 controls the logical value at node 535.

Transistors 545 and 550 are connected in parallel to transistors 510 and 520 to provide the extra current necessary to turn on more number of transistors in driver transistor block 570. In other words, without the operation of transistors 545 and 550, transistors 510 and 520 may not be able to drive all the transistors (in block 570) to an on state. Switches 525-1 and 525-2 may be designed to be turned on by a suitable processor (e.g., DSP, not shown). Transistors 555 and 560 operate similarly in relation to transistors 530 and 540.

Transistors 501 and 502 operate as an inverter (410) and transistors 505 and 506 operate as another invertor (420). The two invertors together operate to delay the input signal to transistor 520 by a time duration 't' in relation to the reception of the same digital data at the gate terminal of transistor 510. Similarly, the input signal is provided in a delayed manner to transistor 540 in relation to the input to transistor 530.

As may be readily appreciated, the delay 't' ensures that driver transistor block 580 will turn off before driver transistor block 570 will turn on when a transition to a high digital signal (1) is received on line 192. Similarly, for a transition to a low digital signal (0) on line 192, transistors 510, 520, 530 and 540 together operate to turn off driver transistor block 570 before driver transistor block 580 turns on. As a result, a path from Vcc to ground is always avoided in the case of either transition.

The operation of the circuit of FIG. 5 is summarized with an example for clarity. Assuming that a value of 0 has been previously received, the transistors in block 580 would be in an on state and the transistors in block 570 would be in an off state. Now assuming that a transition to a high digital signal is received on line 192, NMOS transistor 530 to be turned on with minimal delay (determined by electrical characteristics). The on status of NMOS transistor 530 causes the transistors in block 580 to be turned off with similar minimal delay. The transistors in block 570 would then be turned on after a duration approximately equaling the delay introduced by the two invertors 410 and 420.

Thus, block 570 is turned on only after block 580 is turned off for a transition from 0 to 1 (to high transition). Similarly, in the case of a high to low transition, block 580 turns on after block 570 is turned off. As a result, a path from Vcc to ground may be avoided in both cases.

In addition, as noted above, the number of transistors turned on in each block 570 and 580 depends on the amount of load presented by load $C_L$ 199. The advantages of such a feature are described below frequency spectrums of FIGS. 6A to 6D below.

8. Frequency Spectrum

Figure 6A:
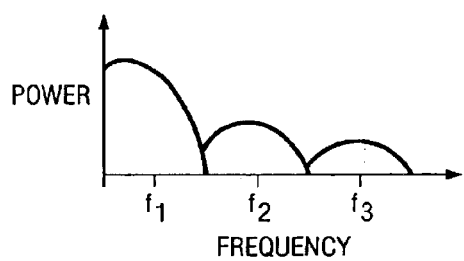
FIGS. 6A to 6D contain frequency spectrums together illustrating the advantages of the embodiment of FIG. 5.
Figure 6C:
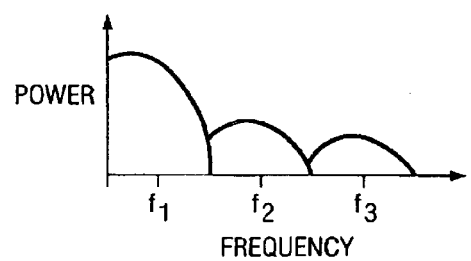
Figure 6B:
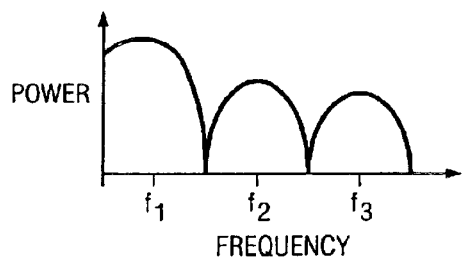
Figure 6D:
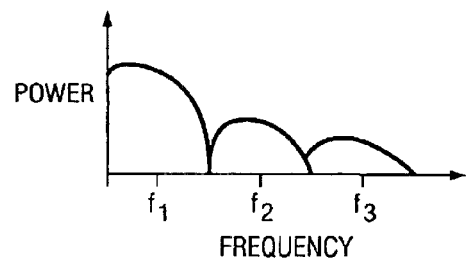

FIGS. 6A–6D together illustrate the frequency spectrum of EMI on sensitive pin 135 in different situations. In particular, FIGS. 6A and 6B relate to a situation in which a constant (i.e., not programmable) drive is used, and FIGS. 6C and 6D relate to a situation in which programmable drive is used. FIGS. 6A and 6C represent the spectrum in case of a high load (for $C_L$ 199), and FIGS. 6B and 6D represent the spectrum in case of a low load. It is further assumed for illustration that frequency f1 is of low frequency, f2 and f3 are high frequencies and the signal received on pin 135 is at high frequency.

FIG. 6A is frequency spectrum on pin 135 for higher loads with constant drive logic. The power induced due to EMI (caused by load pin 197) is high at low frequency f1 and low at high frequencies f2 and f3. The signal received on pin 135 is at high frequency and the voltage induced due to EMI is also low at high frequencies f2 and f3. Thus, EMI caused by load pin 197 is less (and in acceptable range) on pin 135 with constant drive logic, which may be designed to drive higher loads while minimizing EMI. However, the constant drive logic may not be suitable if the load is low as described below with reference to FIG. 6B.

FIG. 6B represents the frequency spectrum on pin 135 for smaller loads with constant drive logic. As the constant drive logic is designed for higher loads (as noted above), a high level of EMI is shown at frequencies f2 and f3 (high frequency). As the input signal is also received at a high frequency, the results of FIG. 6B may not be acceptable. The programmable logic described in sections above addresses such as a problem as described below with reference to FIGS. 6C and 6D.

FIG. 6C is the frequency spectrum on pin 135 for higher loads obtained with programmable output drive logic 195. Programmable output drive logic 195 is initially assumed to be adjusted to drive higher loads. From FIG. 6C, the noise voltage induced is low at higher frequencies f2 and f3, which is similar to FIG. 6A. EMI caused by load pin 197 is reduced for higher loads with programmable drive logic.

FIG. 6D is the frequency spectrum of EMI on pin 135 for smaller loads with programmable output drive logic 195. The driver transistors size (in blocks 570 and 580) in programmable drivers is adjusted to provide sufficient load current to drive load $C_L$ 199 for smaller load strengths. The current Ip through parasitic capacitance Cp 370 is reduced and thus the noise voltage induced on pin 135 would get canceled.

The frequency spectrum for smaller loads (FIG. 6D) with programmable output drive logic 195 is similar to that of higher loads with constant drive logic (FIG. 6A) and programmable output drive logic 195 (FIG. 6C). Thus, EMI may be reduced for different load values with programmable output drive logic 195 according to an aspect of the present invention.

Only for purpose of illustration, the embodiment(s) above are described with reference to load pin providing a digital value to a load, and sensitive pin receiving an analog signal.

However, it will be apparent to one skilled in the relevant arts how to use the approach in relation to other types of pins which cause electro magnetic interference (EMI) by reading the disclosure provided herein. Such other implementations are contemplated to be within the scope and spirit of various aspects of the present invention.

9. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. A method of reducing electro magnetic interference (EMI) caused by a first pin on a second pin, said first pin and said second pin being contained in a package of an integrated circuit, said first pin carrying a strong signal, and said second pin carrying a weaker signal, said method comprising:

providing a third pin;

causing said third pin to carry a second signal, wherein said second signal is equal in magnitude to said strong signal, but has a direction opposite to that of said strong signal, whereby an EMI introduced by said first pin on said second pin is substantially canceled by an EMI introduced by said third pin.

2. The method of claim 1, wherein said first pin is coupled to a load, said strong signal comprises an electric current used to charge said load, said method further comprising:

providing a fourth pin;

causing said fourth pin to carry a third signal when said load is discharged, wherein said third signal is equal in magnitude and opposite in direction to a fourth signal passing through said first pin when said load is discharged, whereby an EMI introduced by said first pin on said second pin when said load is discharged, is substantially canceled by an EMI introduced by said fourth pin.

3. The method of claim 2, wherein said third pin comprises a voltage supply pin and said fourth pin comprises a ground pin.

4. The method of claim 3, further comprising ensuring that a path does not exist between said fourth pin and said third pin during both discharging and charging phases.

5. The method of claim 4, wherein said strong signal is generated according to a digital value sought to be sent to a processor representing said load.

6. The method of claim 5, further comprising using a programmable control logic which drives said load with an amount of current proportionate to an amount of load presented by said load, whereby parasitic currents are minimized leading to further reduction in EMI introduced into said second pin.

7. The method of claim 1, wherein said strong signal comprises an analog signal.

8. A package containing:

a first pin and a second pin, said first pin carrying a strong signal, and second pin carrying a weaker signal, means for causing a third pin to carry a second signal, wherein said second signal is equal in magnitude to said strong signal, but has a direction opposite to that of said strong signal, whereby an EMI introduced by said first pin on said second pin is substantially canceled by an EMI introduced by said third pin.

9. The package of claim 8, wherein said first pin is coupled to a load, said strong signal comprises an electric current used to charge said load, said package further comprising:

means for providing a fourth pin;

means for causing said fourth pin to carry a third signal when said load is discharged, wherein said third signal is equal in magnitude and opposite in direction to a fourth signal passing through said first pin when said load is discharged, whereby an EMI introduced by said first pin on said second pin when said load is discharged, is substantially canceled by an EMI introduced by said fourth pin.

10. The package of claim 9, wherein said third pin comprises a voltage supply pin and said fourth pin comprises a ground pin.

11. The package of claim 10, further comprising ensuring that a path does not exist between said fourth pin and said third pin during both discharging and charging phases.

12. The package of claim 11, wherein said strong signal is generated according to a digital value sought to be sent to a processor representing said load.

13. The package of claim 12, further comprising using a programmable control logic which drives said load with an amount of current proportionate to an amount of load presented by said load, whereby parasitic currents are minimized leading to further reduction in EMI introduced into said second pin.

14. The package of claim 13, wherein said third pin and said fourth pin are located close to said first pin.

15. The package of claim 8, wherein said strong signal comprises an analog signal.

16. A reduction circuit for reducing electro magnetic interference (EMI) caused by a first pin on a second pin, said first pin and said second pin being contained in a package of an integrated circuit, said first pin carrying a strong signal, and second pin carrying a weaker signal, said reduction circuit comprising:

a third pin; and an output drive logic coupled to said third pin and said first pin, said output drive logic causing said third pin to carry a second signal, wherein said second signal is equal in magnitude to said strong signal, but has a direction opposite to that of said strong signal, whereby an EMI introduced by said first pin on said second pin is substantially canceled by an EMI introduced by said third pin.

17. The reduction circuit of claim 16, wherein said first pin is coupled to a load, said strong signal comprises an electric current used to charge said load, said reduction circuit further comprising:

a fourth pin also coupled to said output drive logic, wherein said output drive logic causes said fourth pin to carry a third signal when said load is discharged, wherein said third signal is equal in magnitude and opposite in direction to a fourth signal passing through said first pin when said load is discharged, whereby an EMI introduced by said first pin on said second pin when said load is discharged, is substantially canceled by an EMI introduced by said fourth pin.

18. The reduction circuit of claim 17, wherein said output drive logic comprises a control logic ensuring that a path does not exist between said fourth pin and said third pin during both discharging and charging phases.

19. The reduction circuit of claim 18, wherein said output drive logic further comprises:

a first transistor coupled to said third pin; and a second transistor coupled to said fourth pin, wherein said first pin is coupled to a node connecting a drain terminal of both of said first transistor and said second transistor, wherein said control logic is coupled to a gate terminal of both of said first transistor and said second transistor.

20. The reduction circuit of claim 19, wherein said strong signal comprises an analog signal.

21. The reduction circuit of claim 19, wherein said strong signal is generated associated with providing a digital bit to a processor.

22. The reduction circuit of claim 21, wherein said first transistor is implemented using a first plurality of transistors, wherein only a number of said first plurality of transistors are turned on, wherein said number is proportionate to an amount of load presented by said load, whereby parasitic currents are minimized leading to further reduction in EMI introduced into said second pin.

23. The reduction circuit of claim 21, wherein said output drive logic further comprises:
   a delay circuit receiving said digital bit and generating a delayed output;
   a first pair of transistors to set a node to one logical value upon receiving one value of said digital bit, and to another logical value upon receiving another value of said digital bit, wherein said first plurality of transistors are designed to be turned on or off according to the value on said node.

24. The reduction circuit of claim 23, wherein said delay circuit comprises a plurality of invertors.

25. The reduction circuit of claim 24, wherein said third pin comprises a voltage supply pin and said fourth pin comprises a ground pin, wherein said voltage supply pin and said ground pin are located close to said first pin.

26. A device comprising:
   a processing unit;
   a package coupled to said processing unit, said package containing a first pin and a second pin, said first pin carrying a strong signal, and said second pin carrying a weaker signal; and
   a reduction circuit for reducing electro magnetic interference (EMI) caused by said first pin on said second pin, said reduction circuit comprising:
      a third pin; and
      an output drive logic coupled to said third pin and said first pin, said output drive logic causing said third pin to carry a second signal, wherein said second signal is equal in magnitude to said strong signal, but has a direction opposite to that of said strong signal,
      whereby an EMI introduced by said first pin on said second pin is substantially canceled by an EMI introduced by said third pin.

27. The device of claim 26, wherein said first pin is coupled to a load, said strong signal comprises an electric current used to charge said load, said reduction circuit further comprising:
   a fourth pin also coupled to said output drive logic, wherein said output drive logic causes said fourth pin to carry a third signal when said load is discharged, wherein said third signal is equal in magnitude and opposite in direction to a fourth signal passing through said first pin when said load is discharged,
   whereby an EMI introduced by said first pin on said second pin when said load is discharged, is substantially canceled by an EMI introduced by said fourth pin.

28. The device of claim 27, wherein said output drive logic comprises a control logic ensuring that a path does not exist between said fourth pin and said third pin during both discharging and charging phases.

29. The device of claim 28, wherein said output drive logic further comprises:
   a first transistor coupled to said third pin; and
   a second transistor coupled to said fourth pin, wherein said first pin is coupled to a node connecting a drain terminal of both of said first transistor and said second transistor, wherein said control logic is coupled to a gate terminal of both of said first transistor and said second transistor.

30. The device of claim 29, wherein said strong signal comprises an analog signal.

31. The device of claim 29, wherein said strong signal is generated associated with providing a digital bit to a processor.

32. The device of claim 31, wherein said first transistor is implemented using a first plurality of transistors, wherein only a number of said first plurality of transistors are turned on, wherein said number is proportionate to an amount of load presented by said load, whereby parasitic currents are minimized leading to further reduction in EMI introduced into said second pin.

33. The device of claim 31, wherein said output drive logic further comprises:
   a delay circuit receiving said digital bit and generating a delayed output;
   a first pair of transistors to set a node to one logical value upon receiving one value of said digital bit, and to another logical value upon receiving another value of said digital bit, wherein said first plurality of transistors are designed to be turned on or off according to the value on said node.

34. The device of claim 33, wherein said delay circuit comprises a plurality of invertors.

35. The device of claim 34, wherein said third pin comprises a voltage supply pin and said fourth pin comprises a ground pin, wherein said voltage supply pin and said ground pin are located close to said first pin.

36. The device of claim 35, further comprising:
   an antenna receiving an external signal, wherein said analog signal is generated based on said external signal; and
   an analog to digital converter converting an input signal to generate said digital bit, wherein said input signal is generated based on said analog signal,
   wherein said load is comprised in said processing unit.

37. The invention of claim 36, wherein said device comprises one of a mobile phone and a global positioning system receiver.

* * * * *